United States Patent
Li et al.

(10) Patent No.: US 12,242,687 B2
(45) Date of Patent: Mar. 4, 2025

(54) TOUCH DISPLAY DEVICE AND DISPLAY SYSTEM

(71) Applicants: Chengdu BOE Optoelectronics Technology Co., Ltd., Sichuan (CN); BOE Technology Group Co., Ltd., Beijing (CN)

(72) Inventors: Zewen Li, Beijing (CN); Wenxiao Niu, Beijing (CN); Hengzhen Liang, Beijing (CN); Xu Lu, Beijing (CN); Lianbin Liu, Beijing (CN); Zhiqiang Wang, Beijing (CN); Rendong Li, Beijing (CN); Yu Wang, Beijing (CN)

(73) Assignees: CHENGDU BOE OPTOELECTRONICS TECHNOLOGY CO., LTD., Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/273,277

(22) PCT Filed: Nov. 19, 2021

(86) PCT No.: PCT/CN2021/131697
§ 371 (c)(1),
(2) Date: Jul. 20, 2023

(87) PCT Pub. No.: WO2022/193707
PCT Pub. Date: Sep. 22, 2022

(65) Prior Publication Data
US 2024/0310940 A1    Sep. 19, 2024

(30) Foreign Application Priority Data
Mar. 17, 2021 (CN) .......................... 202110286297.2

(51) Int. Cl.
G06F 3/041 (2006.01)
G06F 3/044 (2006.01)
H05K 1/18 (2006.01)

(52) U.S. Cl.
CPC .......... *G06F 3/0416* (2013.01); *G06F 3/0412* (2013.01); *G06F 3/0446* (2019.05);
(Continued)

(58) Field of Classification Search
None
See application file for complete search history.

(56) References Cited

U.S. PATENT DOCUMENTS 10,133,419 B2 * 11/2018 Ludden ................. G06F 3/0443
2015/0029413 A1 * 1/2015 Chang ................... G06F 3/0412
349/12

FOREIGN PATENT DOCUMENTS

CN    110045874 A    7/2019
CN    209199067 U    8/2019
(Continued)

OTHER PUBLICATIONS

International Search Report issued Feb. 23, 2022 in PCT/CN2021/131697 with English translation thereof.
(Continued)

*Primary Examiner* — Brian M Butcher
(74) *Attorney, Agent, or Firm* — XSENSUS LLP (57) ABSTRACT

A touch display device, including: a touch display substrate, provided with a display region and a non-display region provided adjacent to the display region, wherein the non-display region is provided with a display bonding region and a touch bonding region; and a flexible circuit board, provided with a touch signal line, a touch chip and a display signal line, wherein the touch signal line is connected with the touch chip, the flexible circuit board is bound with the
(Continued)

touch display substrate in the display bonding region and the touch bonding region, the touch chip is connected to the touch bonding region through the touch signal line, and the display signal line is connected to the display bonding region; where the touch chip, the touch signal line and the touch bonding region are provided on a same side of the display signal line.

19 Claims, 9 Drawing Sheets

(52) U.S. Cl.
CPC ... *H05K 1/189* (2013.01); *G06F 2203/04102* (2013.01); *H05K 2201/10128* (2013.01)

(56) References Cited

FOREIGN PATENT DOCUMENTS

| | | |
|---|---|---|
| CN | 111290157 A | 6/2020 |
| CN | 111919164 A | 11/2020 |
| CN | 112162662 A | 1/2021 |
| CN | 112860122 A | 5/2021 |
| KR | 20150057323 A | 5/2015 |
| KR | 102095240 B1 | 3/2020 |
| KR | 20210024437 A | 3/2021 |
| TW | 202122975 A | 6/2021 |
| WO | 2021/031093 A1 | 2/2021 |

OTHER PUBLICATIONS

Written Opinion issued Feb. 23, 2022 in PCT/CN2021/131697 with English translation thereof.

* cited by examiner

TOUCH DISPLAY DEVICE AND DISPLAY SYSTEM

CROSS-REFERENCE TO RELATED APPLICATIONS

The present disclosure is based upon International Application No. PCT/CN2021/131697 filed on Nov. 19, 2021, and claims priority to Chinese Patent Application No. 202110286297.2 entitled "Touch display device and display system", filed on Mar. 17, 2021, the entire contents of both of which are incorporated herein by reference.

TECHNICAL FIELD

The present disclosure relates to the technology field of display, particularly, to a touch display device and a display system including the touch display device.

BACKGROUND

In recent years, the touch panel has shifted from an external mounted structure to a surface covered (on cell) structure for reduced cost and technical upgrade. The touch structure is integrated on the encapsulation layer (TFE) of the display substrate, thereby reducing an optically clear adhesive (OCA) layer and a COP (Cyclo Olefin Polymer, which is a cycloolefin polymer) optical material layer, and reducing the thickness and cost of the touch display device. In this way, the components originally on the touch flexible circuit board need to be provided on the flexible circuit board. Since the number of components increases, but the space of the flexible circuit board does not increase due to the space limitation of the whole machine, in order to avoid the interference problem of the display signal and the touch signal, a multi-layer flexible circuit board needs to be used.

However, the multi-layer flexible circuit board, in turn, may lead to problems of increased thickness, increased cost, and being not easy to bend, and still may generate problems of signal attenuation and new interference.

It should be noted that the information disclosed in the above background part is only used to enhance the understanding of the background of the present disclosure, and therefore may include information that does not constitute the related art known to those of ordinary skill in the art.

SUMMARY

The purpose of the present disclosure is to overcome the defect in the related art that signal interference is prone to be generated, and provide a touch display device that does not prone to generate signal interference, and a display system including the touch display device.

According to an aspect of the present disclosure, there is provided a touch display device, including:
  a touch display substrate, provided with a display region and a non-display region provided adjacent to the display region, where the non-display region is provided with a display bonding region and a touch bonding region; and
  a flexible circuit board, provided with a touch signal line, a touch chip and a display signal line, where the touch signal line is connected with the touch chip, the flexible circuit board is bound with the touch display substrate in the display bonding region and the touch bonding region, the touch chip is connected to the touch bonding region through the touch signal line, and the display signal line is connected to the display bonding region; where the touch chip, the touch signal line and the touch bonding region are provided on a same side of the display signal line.

In some embodiments of the present disclosure, the flexible circuit board is configured as a two-layer board, the two-layer board at least includes a first function layer, a second function layer, and a substrate layer provided between the first function layer and the second function layer, the display signal line is provided on the first function layer, and the touch signal line is provided on the second function layer.

In some embodiments of the present disclosure, in the touch bonding region, the touch display substrate includes a plurality of touch bonding pins, at least two touch bonding pins are arranged in a second direction to form a group, a plurality of groups of the touch bonding pins are arranged in a first direction, and the first direction intersects with the second direction.

In some embodiments of the present disclosure, the touch bonding pins include a first touch driving bonding pin, a second touch driving bonding pin and a first touch sensing bonding pin; the first touch driving bonding pin, the second touch driving bonding pin and the first touch sensing bonding pin are all provided at intervals, and the first touch driving bonding pin is located between the second touch driving bonding pin and the first touch sensing bonding pin; or, the touch bonding pins include a first touch driving bonding pin and a first touch sensing bonding pin, and the first touch driving bonding pin and the first touch sensing bonding pin are provided at intervals.

In some embodiments of the present disclosure, in the touch bonding region, the touch display substrate further includes a plurality of ground bonding pins and a plurality of protection bonding pins, and a group length of the group formed by the at least two touch bonding pins arranged in the second direction is less than or equal to a length of the ground bonding pins or the protection bonding pins in the second direction.

In some embodiments of the present disclosure, in the display region, the touch display substrate includes:
  a plurality of pixel units arranged in an array, where each pixel unit includes at least three sub-pixels, each sub-pixel includes a thin film transistor, and the thin film transistor includes a gate, a gate insulation layer, an active layer, a source and a drain; and
  a touch structure, provided on a side of the pixel unit, where the touch structure including a plurality of first touch units and a plurality of second touch units.

In some embodiments of the present disclosure, a first touch unit is a touch driving unit, a second touch unit is a touch sensing unit, an end of the first touch unit is connected to the first touch driving bonding pin through a first touch driving lead, and the second touch unit is connected to the first touch sensing bonding pin through a touch sensing lead.

In some embodiments of the present disclosure, another opposite end of the first touch unit is connected to the second touch driving bonding pin through a second touch driving lead.

In some embodiments of the present disclosure, the second touch driving lead is provided on a same layer and with a same material as the source and the drain.

In some embodiments of the present disclosure, the non-display region is further provided with a bending region and a lead region; the bending region is located between the display bonding region and the touch bonding region and the lead region; and in the lead region, the first touch driving lead is provided on a same layer and with a same material as a second touch metal layer of the touch structure.

In some embodiments of the present disclosure, in the lead region, the touch sensing lead is provided on a same layer and with a same material as a first touch metal layer of the touch structure.

In some embodiments of the present disclosure, in the bending region, the touch sensing lead and the first touch driving lead are provided on a same layer and with a same material as the source and the drain.

In some embodiments of the present disclosure, the flexible circuit board is provided with a third touch driving bonding pin, a fourth touch driving bonding pin and a second touch sensing bonding pin; the third touch driving bonding pin is bound to or orthographic projection overlapped with the first touch driving bonding pin, the fourth touch driving bonding pin is bound to or orthographic projection overlapped with the second touch driving bonding pin, and the second touch sensing bonding pin is bound to or orthographic projection overlapped with the first touch sensing bonding pin.

According to another aspect of the present disclosure, there is provided a display system, including the touch display device according to any one of the above.

In the touch display device and the display system of the present disclosure, the touch chip, the touch signal line and the touch bounding region are provided on the same side of the display signal line, and the touch chip is directly connected to the touch bounding region through the touch signal line. The touch signal line and the display signal line will not intersect with each other. Therefore, there will be no signal interference between the touch signal line and the display signal line, and there is no need to use a multi-layer flexible circuit board to avoid signal interference. Thus, there will be no problems of increased thickness, increased cost, and being not easy to bend when using the multi-layer flexible circuit board, nor will there be problems of signal attenuation and new interference.

It should be understood that the above general description and the following detailed description are merely exemplary and explanatory, and cannot limit the present disclosure.

BRIEF DESCRIPTION OF THE DRAWINGS

The accompanying drawings here, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DESCRIPTION OF THE REFERENCE NUMBERS

1. Base substrate; 2. Heat dissipation film;
31. First substrate; 32. Second substrate;
4. Display structure; 41. Gate line; 42. Gate insulation layer; 43. Data line; 44. First planarization layer; 45. Second planarization layer;
5. Encapsulation layer; 6. First optical adhesive layer; 7. COP optical material layer;
8. Touch structure; 8a. First touch metal layer; 8b. Second touch metal layer;
81. First touch unit; 811. First touch electrode; 812. First touch driving lead; 813. Second touch driving lead; 814. First touch driving bonding pin; 815. Second touch driving bonding pin;
82. Second touch unit; 821. Second touch electrode; 822. Touch sensing lead; 823. First touch sensing bonding pin;
83. First insulation layer; 84. Second insulation layer; 85. Buffer layer; 86. Ground bonding pin; 87. Protection bonding pin; 88. First connection portion;
9. Polarizer; 10. Second optical adhesive layer; 11. Cover plate;
121. Flexible circuit board; 1211. Display signal line; 122. Touch flexible circuit board;
13. Touch chip; 131. Touch signal line;
14. Display driving chip; 15. Protection adhesive layer; 16. BTB connector;
171. Third touch driving bonding pin; 172. Fourth touch driving bonding pin; 173. Second touch sensing bonding pin;
181. Shielding layer; 182. Protection layer; 183. Base layer; 184. First function layer;
185. Second function layer.
AA. Display region; FA. Non-display region; BOD1. Display bonding region; BOD2. Touch bonding region; GR. Interference position; C1. First side region; C2. Second side region; C3. Third side region; C4. Fourth side region;
R. Resistor, C. Capacitor.

DETAILED DESCRIPTION

Example implementations will now be described more fully with reference to the accompanying drawings. However, the example embodiments can be implemented in various forms and should not be construed as limited to the embodiments set forth herein; by contrast, these embodiments are provided so that the present disclosure will be thorough and complete, and will fully convey the concept of example embodiments to those of ordinary skill in the art. The same reference numbers in the drawings denote the same or similar structures, and thus their detailed description will be omitted. In addition, the drawings are merely schematic illustrations of the present disclosure, and are not necessarily drawn to scale.

Although relative terms such as "upper" and "lower" are used in the description to describe the relative relationship of one component to another component shown in the drawings, these terms are used in the description only for convenience, for example, according to the directions shown in the accompanying drawings. It will be appreciated that if the device shown in the drawings is turned over so that it is upside down, then component described as being "upper" will become the component that are "lower". When a structure is "on" another structure, it may mean that a structure is integrally formed on another structure, or that a structure is "directly" placed on another structure, or that a structure is "indirectly" placed on another structure through another structure.

The terms "a", "an", "the", "said" and "at least one" are used to indicate the presence of one or more elements/components/etc.; the terms "comprising" and "including" are used to indicate an open inclusion and means that there may be additional elements/components/etc. in addition to the listed elements/components/etc.; the terms "first", "second" and "third" etc. are only used as a marker, not a limit on the number of its objects.

In the description, "parallel" refers to a state where an angle formed by two straight lines is −10° or more and 10° or less, and therefore also includes a state where the angle is −5° or more and 5° or less. In addition, "vertical" refers to a state where the angle formed by two straight lines is 80° or more and 100° or less, and therefore also includes a state where the angle more than 85° or more and 95° or less.

Figure 1:
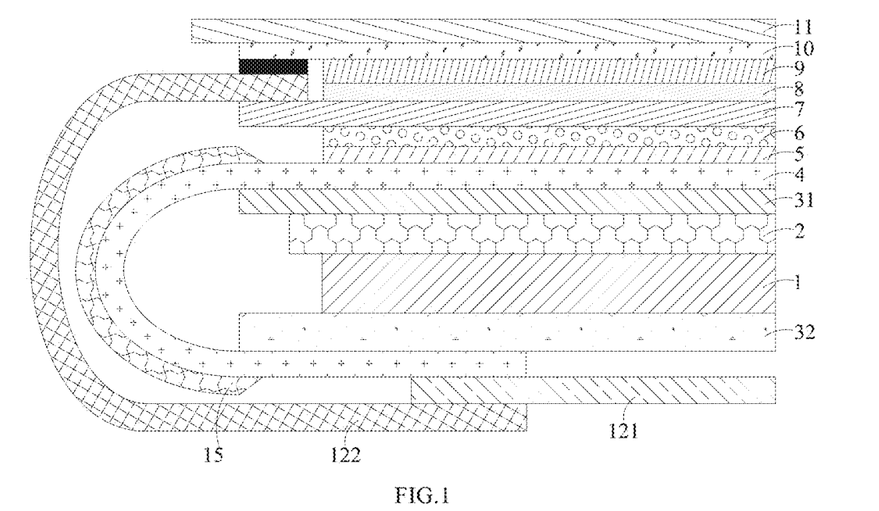
FIG. 1 is a schematic structural diagram of a touch display device with an external mounted touch panel.

Referring to the schematic structural diagram of a touch display device with an external mounted touch panel, as shown in FIG. 1, the touch display device may include a base substrate 1, a heat dissipation film 2 provided on a side of the base substrate 1, a first substrate 31 provided on a side of the heat dissipation film 2 away from the base substrate 1, a display structure 4 provided on a side of the first substrate 31 away from the base substrate 1, an encapsulation layer 5 provided on a side of the display structure 4 away from the base substrate 1, a first optical adhesive layer 6 provided on a side of the encapsulation layer 5 away from the base substrate 1, a COP (Cyclic Olefin Polymer, which is a cycloolefin polymer) optical material layer 7 provided on a side of the first optical adhesive layer 6 away from the base substrate 1, a touch structure 8 provided on a side of the COP optical material layer 7 away from the base substrate 1, a polarizer 9 provided on a side of the touch structure 8 away from the base substrate 1, a second optical adhesive layer 10 provided on a side of the polarizer 9 away from the base substrate 1, and a cover plate 11 provided on a side of the second optical adhesive layer 10 away from the base substrate 1. The other side of the base substrate 1 opposite to the heat dissipation film 2 is provided with a second substrate 32, the display structure 4 is bent to a side of the second substrate 32 away from the base substrate 1 and is bound to the flexible circuit board 121, and the flexible circuit board 121 is provided on a side of the display structure 4 away from the base substrate 1. A protection adhesive layer 15 is provided on the bending outer side at the bending position of the display structure 4. One end of the touch flexible circuit board 122 is bound to the touch structure 8, and after the touch flexible circuit board 122 is bent, another opposite end of the touch flexible circuit board 122 is bound to the flexible circuit board 121, and is located on a side of the flexible circuit board 121 away from the base substrate 1.

Figure 2:
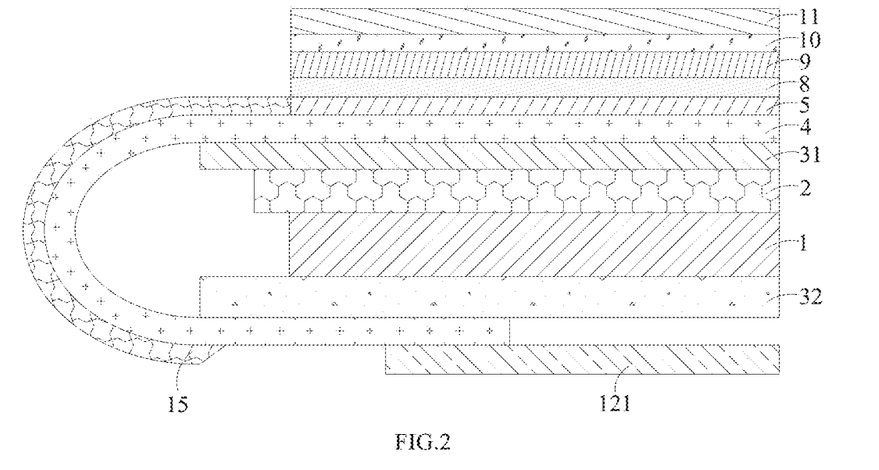
FIG. 2 is a schematic structural diagram of a touch display device with a surface covered touch panel.

Referring to the schematic structural diagram of a touch display device with a surface covered touch panel, as shown in FIG. 2, the touch display device may include a base substrate 1, a heat dissipation film 2 provided on a side of the base substrate 1, a first substrate 31 provided on a side of the heat dissipation film 2 away from the base substrate 1, a display structure 4 provided on a side of the first substrate 31 away from the base substrate 1, an encapsulation layer 5 provided on a side of the display structure 4 away from the base substrate 1, a touch structure 8 provided on a side of the encapsulation layer 5 away from the base substrate 1, a polarizer 9 provided on a side of the touch structure 8 away from the base substrate 1, a second optical adhesive layer 10 provided on a side of the polarizer 9 away from the base substrate 1, and a cover plate 11 provided on a side of the second optical adhesive layer 10 away from the base substrate 1. A second substrate 32 is provided on the other side of the base substrate 1 opposite to the heat dissipation film 2, the display structure 4 is bent to a side of the second substrate 32 away from the base substrate 1 and is bound to a flexible circuit board 121, and the flexible circuit board 121 is provided on the side of the display structure 4 away from the base substrate 1. A protection adhesive layer 15 is provided on the bending outer side at the bending position of the display structure 4. The touch structure 8 is connected to the display structure 4, and a signal of the touch structure 8 is connected to the flexible circuit board 121 through the display structure 4.

It can be obtained from the drawings that, in the surface covered touch display device compared to the external mounted touch display device, the first optical adhesive layer 6 and the COP optical material layer 7 are omitted, so that the thickness and cost of the touch display device are reduced. Moreover, the touch flexible circuit board 122 is omitted, and components on the original touch flexible circuit board 122 need to be provided on the flexible circuit board 121. Since the number of components increases, but the space of the flexible circuit board does not increase due to the space limitation of the whole machine, in order to avoid the interference problem of the display signal and the touch signal, a multi-layer flexible circuit board 121 needs to be used.

Figure 3:
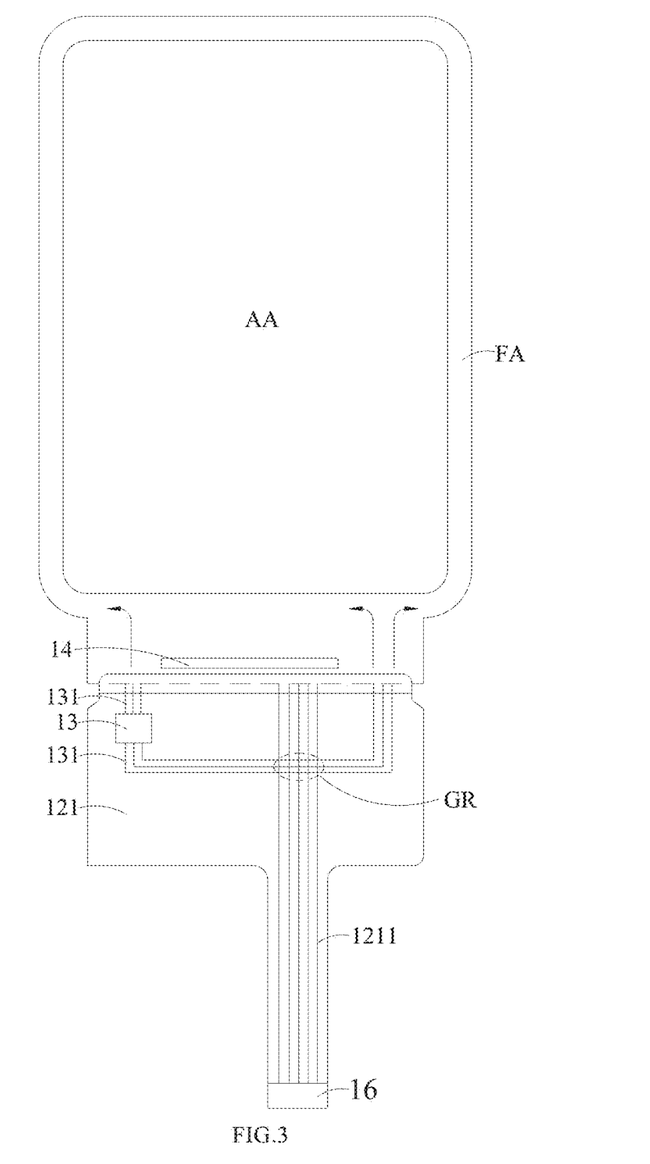
FIG. 3 is a schematic top view structural diagram of a surface covered touch display device when the touch display device is unfolded.
Figure 4:
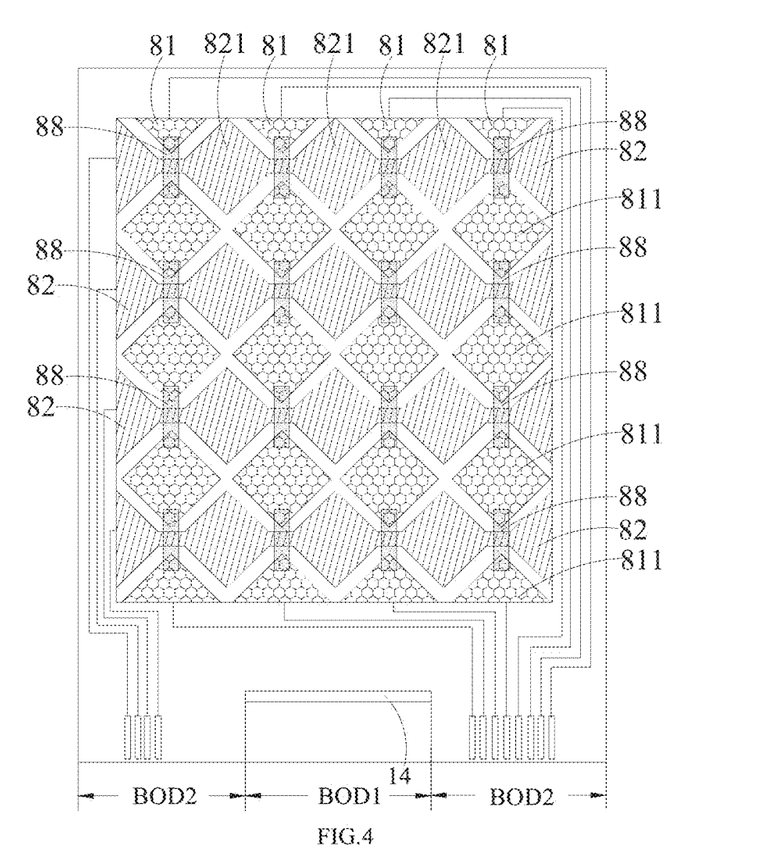
FIG. 4 is a schematic top view structural diagram of a touch display substrate.

In addition, referring to the schematic top view structural diagram of a surface covered touch display device when the touch display device is unfolded, as shown in FIG. 3, where the arrows in the drawing show the directions of the touch bounding leads, and the schematic top view structural diagram of a touch display substrate as shown in FIG. 4, the touch chip 13 also needs to be provided on the flexible circuit board 121, and the touch chip 13 needs to be bound with the touch structure. Display signal lines 1211 are provided on the flexible circuit board 121, and the display signal line 1211 starts from a BTB connector 16 and extends upwards to a display bonding pin. The touch bonding pins bound with the touch chip 13 are provided on both sides of the display bonding pins bound with the display signal lines 1211, and therefore, the display signal line 1211 may intersect with the touch signal line 131, so that there may be a risk of interference between the display signal and the touch signal at the interference position GR.

The flexible circuit board 121 may adopt a multi-layer board to avoid interference between the display signal and the touch signal, that is, the touch signal line 131 and the display signal line 1211 are distributed on different layers between which an entire ground line layer is added, so that the purpose of avoiding signal interference can be achieved. Theoretically, the thicker the ground line layer is, the better the shielding effect is. The currently used multi-layer flexible circuit board 121 is of six layers, four layers, or three layers, most commonly. However, the multi-layer flexible circuit board 121 mainly has two problems: the first problem is multiplied thickness, increased cost, and being not easy to bend; the second problem is the problem of signal attenuation and new interference. The component region is located on the first layer, the components are connected to the interfaces of the display signal lines and touch signal lines through the bonding pins, and the bonding pins are provided on the third layer. The bonding pins of the third layer are connected to the component region of the first layer, in which a long-distance via hole connection is needed to be used for conduction. On one hand, the length of the signal channel is increased, resulting in an increase in channel impedance and severe signal attenuation, on another hand, the long-distance via hole causes an increase in parasitic capacitance (noise), further increasing signal attenuation and affecting display and touch performance; on still another hand, defects related to via hole production (disconnection, short circuit, etc.) will also increase accordingly.

Figure 5:
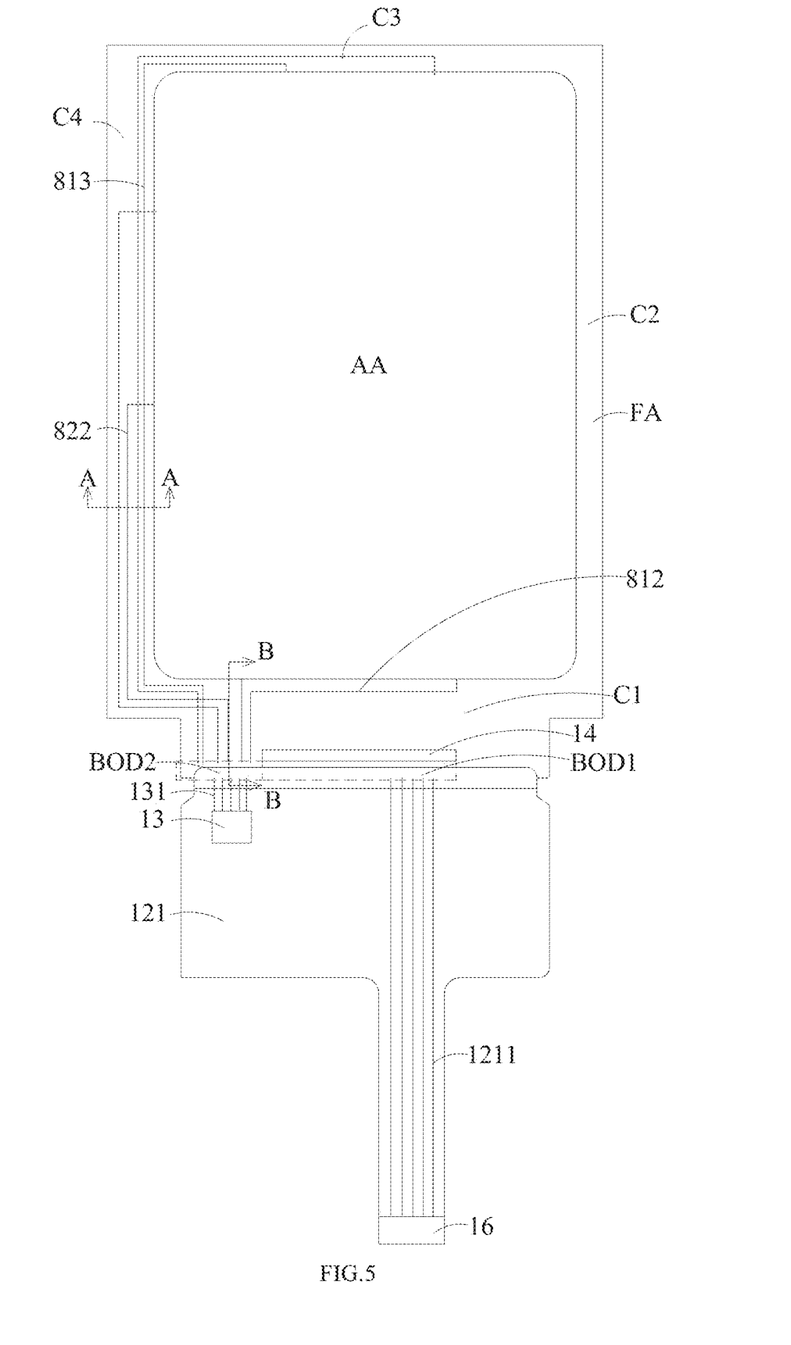
FIG. 5 is a schematic structural diagram of a touch display device according to some embodiments of the present disclosure.

Embodiments of the present disclosure provide a touch display device. FIG. 5 shows the schematic structural diagram of the touch display device, in which the arrow shows the direction of the touch bonding lead. The touch display device may include a touch display substrate and a flexible circuit board 121; the touch display substrate has a display region AA and a non-display region FA provided adjacent to the display region AA, and the non-display region FA is provided with a display bonding region BOD1 and a touch bonding region BOD2. The flexible circuit board 121 is provided with touch signal lines 131, a touch chip 13 and display signal lines 1211; the touch signal line 131 is connected to the touch chip 13; the flexible circuit board 121 is bound with the touch display substrate in the display bonding region BOD1 and the touch bonding region BOD2; the touch chip 13 is connected to the touch bonding region BOD2 through the touch signal line 131, and the display signal line 1211 is connected to the display bonding region BOD1; where, the touch chip 13, the touch signal lines 131 and the touch bonding region BOD2 are provided on the same side of the display signal lines 1211.

In the touch display device of the present disclosure, the touch chip 13, the touch signal lines 131, and the touch bounding region BOD2 are provided on the same side of the display signal lines 1211, the touch chip 13 is directly connected to the touch bounding region BOD2 through the touch signal line 131, and the touch signal line 131 may not intersect with the display signal line 1211. Therefore, there will be no signal interference between the touch signal line 131 and the display signal line 1211, and there is no need to use a multi-layer flexible circuit board 121 to avoid signal interference. Thus, there will be no problems of increased thickness, increased cost, and being not easy to bend when using a multi-layer flexible circuit board 121, nor will there be problems of signal attenuation and new interference.

The touch display substrate may include a base substrate 1, and the base substrate 1 may be a hard substrate, for example, a glass substrate, a plastic substrate, or the like; or, the base substrate 1 may be a flexible substrate, for example, a polyimide substrate.

The touch display substrate has a display region AA and a non-display region FA adjacent to the display region AA, and the display region AA may be rectangular, circular, etc. The non-display region FA is provided with a lead region, a bending region, a display bonding region BOD1 and a touch bonding region BOD2. The bending region is located between the lead region and the display bonding region BOD1 and the touch bonding region BOD2. The touch display substrate can be bent in the bending region to form an arc. The lead region may surround the display region AA; in a case that the display region AA is rectangular, the lead region may include a first side region C1, a second side region C2, a third side region C3, and a fourth side region C4; where, the first side region C1 is provided between the display region AA and the display bonding region BOD1 and the touch bonding region BOD2, and the second side region C2, the third side region C3, and the fourth side region C4 are sequentially arranged counterclockwise.

The display region AA is provided with a touch structure 8 and a display structure 4 (not shown in the drawing). The display structure 4 is a plurality of pixel units arranged in an array, and the touch structure 8 is provided on a side of the display structure 4 away from the base substrate 1. Each pixel unit may include at least three sub-pixels, where each sub-pixel may include a thin film transistor. The thin film transistor may include a gate, a gate insulation layer 42, an active layer, a source, and a drain. The gate is connected to the display bounding region BOD1 through a gate line 41, and the source or the drain is connected to the display bounding region BOD1 through a data line 43.

Figure 6:
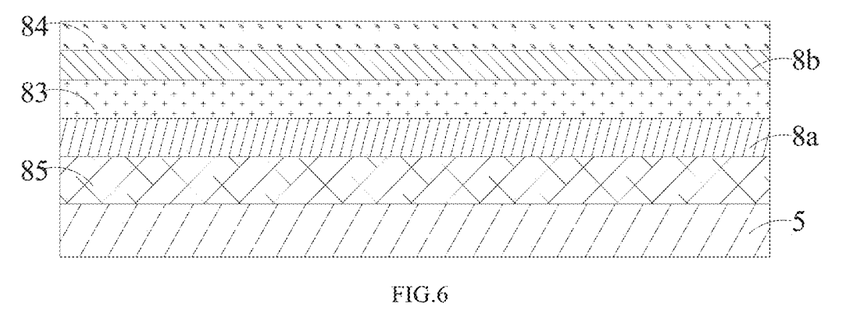
FIG. 6 is a schematic diagram of a layered structure of a touch structure.

Referring to the schematic diagram of a layered structure of the touch structure as shown in FIG. 6, the touch structure 8 may include a buffer layer 85 provided on the encapsulation layer 5, a first touch metal layer 8a provided on a side of the buffer layer 85 away from the encapsulation layer 5, a first insulation layer 83 provided on a side of the first touch metal layer 8a away from the encapsulation layer 5, a second touch metal layer 8b provided on a side of the first insulation layer 83 away from the encapsulation layer 5, and a second insulation layer 84 provided on a side of the second touch metal layer 8b away from the encapsulation layer 5.

Figure 7:
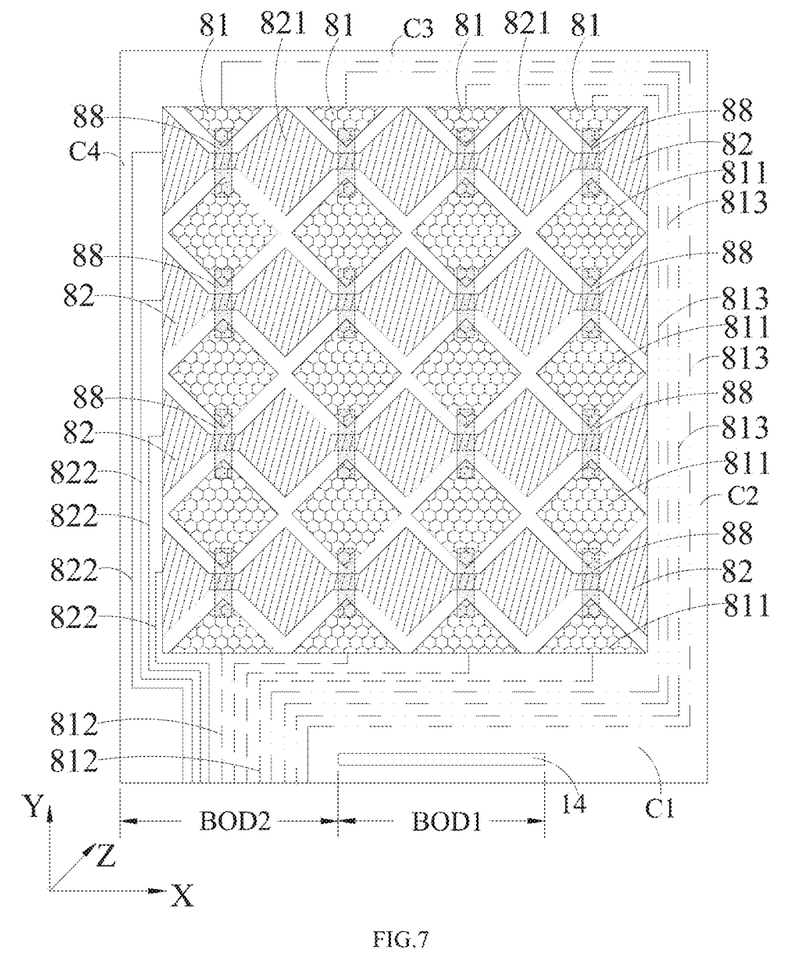
FIG. 7 is a schematic structural diagram of a touch structure in a touch display device according to some embodiments of the present disclosure.
Figure 8:
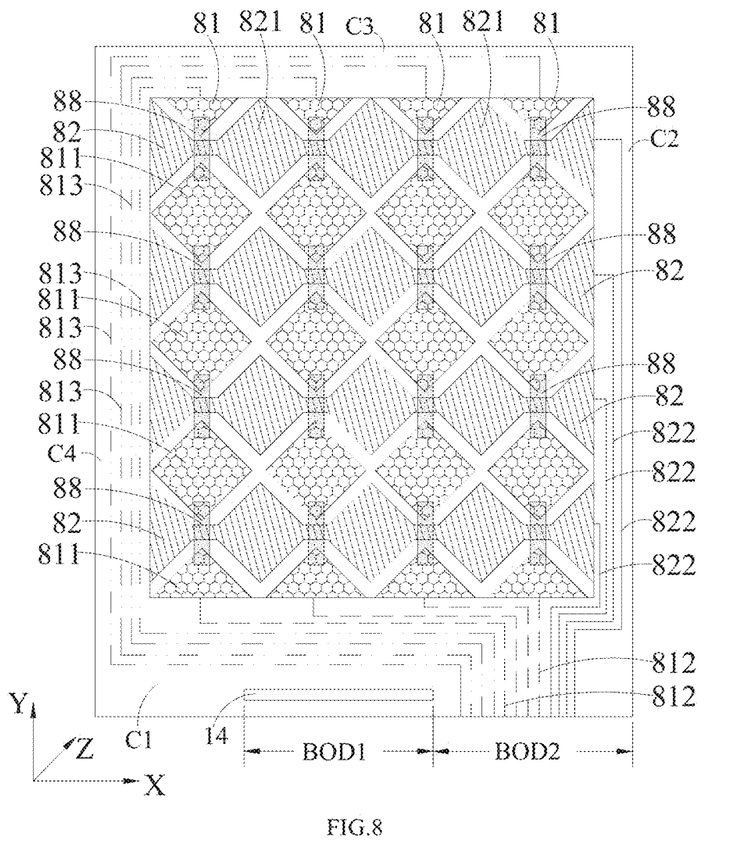
FIG. 8 is a schematic structural diagram of a touch structure in a touch display device according to some embodiments of the present disclosure.

The touch structure 8 may be a mutual-capacitive structure. Referring to FIG. 7 and FIG. 8, the touch structure 8 may include a plurality of first touch units 81 and a plurality of second touch units 82. The second touch unit 82 has a line shape extending along a first direction X, and the plurality of second touch units 82 are sequentially arranged in a second direction Y. The first touch unit 81 has a line shape extending in the second direction Y, the plurality of first touch units 81 are sequentially arranged in the first direction X, and the first direction X intersects with the second direction Y. Each first touch unit 81 may include a plurality of first touch electrodes 811 and first connection portions 88 sequentially arranged in the second direction Y, the plurality of first touch electrodes 811 are provided at intervals, and adjacent first touch electrodes 811 are connected to each other through a first connection portion 88. Each of the second touch units 82 may include a plurality of second touch electrodes 821 and second connection portions sequentially arranged in the first direction X, the plurality of second touch electrodes 821 are provided at intervals, and the adjacent second touch electrodes 821 are connected to each other through a second connection portion.

The first touch electrode 811 and the second touch electrode 821 are alternately arranged in a third direction Z to form a capacitor. By detecting the change in the capacitor, the position of the touch point may be determined. The third direction Z intersects with the first direction X and the second direction Y. In some embodiments, the third direction Z is perpendicular to the plane formed by the first direction X and the second direction Y.

In some example embodiments, the first touch electrode 811, the second touch electrode 821, and the second connection portion are provided on the same layer, and may be formed by a single patterning process; the second touch electrode 821 and the second connection portion are of an integrated structure; the first connection portion 88 may be provided on a bridging layer to form a bridging structure, and an insulation layer is provided between the first connection portion 88 and the second connection portion. In some other example embodiments, the first touch electrode 811, the first connection portion 88, and the second touch electrode 821 are provided on the same layer, and may be formed by a single patterning process; the first touch electrode 811 and the first connection portion 88 are of an integrated structure; the second connection portion may be provided on a bridging layer to form a bridging structure, and an insulation layer is provided between the first connection portion 88 and the second connection portion.

In some example embodiments, the first touch electrode 811 may be a driving electrode, and the second touch electrode 821 may be a sensing electrode. Or, the first touch electrode 811 may be a sensing electrode, and the second touch electrode 821 may be a driving electrode. The plurality of first touch units 81 and the plurality of second touch units 82 form an array of M rows of driving electrodes*N columns of sensing electrodes, that is, including M first touch units 81 and N second touch units 82, where M and N are positive integers greater than two.

In some example embodiments, the first touch electrode 811 and the second touch electrode 821 may have a diamond shape, for example, may be a regular diamond, or a transversely long diamond, or a longitudinally long diamond. In some possible embodiments, the first touch electrode 811 and the second touch electrode 821 may have any one or more shapes of a triangle, a square, a trapezoid, a parallelogram, a pentagon, a hexagon, and other polygons, which is not limited here.

In some example embodiments, the first touch electrode 811 and the second touch electrode 821 may be in the form of a transparent conductive electrode. In some example embodiments, the first touch electrode 811 and the second touch electrode 821 may be in the form of a metal grid. The metal grid is formed by interweaving a plurality of metal lines, the metal grid includes a plurality of grid patterns, and the grid pattern is a polygon formed by the plurality of metal lines. The first touch electrode 811 and the second touch electrode 821 in the form of a metal grid have the advantages of small resistance, small thickness, high reaction speed and the like.

In some example embodiments, as shown in FIG. 7, FIG. 8, FIG. 9, and FIG. 10, in the non-display region FA, the touch structure 8 may include a plurality of first touch driving leads 812, a plurality of second touch driving leads 813, and a plurality of touch sensing leads 822 (for clarity, different leads in the drawing being distinguished by using different line types). The touch bonding region BOD2 is provided with a plurality of touch bonding pins. The touch bonding pins include a first touch sensing bonding pin 823, a first touch driving bonding pin 814, and a second touch driving bonding pin 815.

A first end of the first touch driving lead 812 is correspondingly connected to the first touch unit 81, a second end of the first touch driving lead 812 is led out through an edge region to the first touch driving bonding pin 814. The second touch driving lead 813 is correspondingly connected to another opposite end of the first touch unit 81, and a second end of the second touch driving lead 813 is led out to the second touch driving bonding pin 815. A first end of the touch sensing lead 822 is correspondingly connected to an end of the second touch unit 82, and a second end of the touch sensing lead 822 is led out to the first touch sensing bonding pin 823.

In some example embodiments, the first end of the first touch driving lead 812 is connected to an end of the first touch unit 81 adjacent to the bonding region, and the second end of the first touch driving lead 812 is directly led out to the first touch driving bonding pin 814. The first end of the second touch driving lead 813 is connected to an end of the first touch unit 81 away from the bonding region, and the second touch driving lead 813 is led out to the second touch driving bonding pin 815 through the third side region C3, the second side region C2, and the first side region C1. The first end of the touch sensing lead 822 is connected to an end of the second touch unit 82, and the touch sensing lead 822 is led out to the first touch sensing bonding pin 823 through the fourth side region C4 and the first side region C1.

In the non-display region FA, the touch structure 8 includes N touch sensing leads 822, M first touch driving leads 812 and M second touch driving leads 813. During touch operation, a touch detection signal is input to each row of the second touch electrodes 821 through the N touch sensing leads 822, to detect each row of second touch electrodes 821. The touch detection signal is input to each column of the first touch electrodes 811 through the M first touch driving leads 812 and the M second touch driving leads 813, to jointly detect each column of the first touch electrodes 811. When the first touch electrode 811 is a driving electrode and the second touch electrode 821 is a sensing electrode, this connection manner can be called as 2TIR. However, the example embodiments of the present disclosure are not limited to the foregoing description, for example, only one end of the two ends of each column of first touch units 81 may be led out.

The first touch sensing bonding pin 823, the first touch driving bonding pin 814 and the second touch driving bonding pin 815 are all located on the same side of the display driving chip 14. For example, referring to FIG. 7, the touch bonding region BOD2 may be located on the left side of the display driving chip 14; and referring to FIG. 8, the touch bonding region BOD2 may also be located on the right side of the display driving chip 14.

Figure 9:
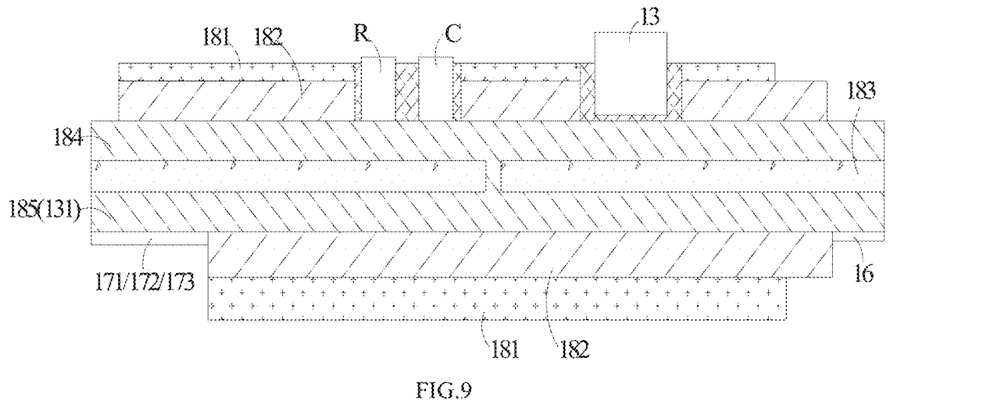
FIG. 9 is a schematic cross-sectional view of a flexible circuit board in a touch display device according to some embodiments of the present disclosure.

In some example embodiments, referring to the schematic structural diagram of the flexible circuit board as shown in FIG. 9, the flexible circuit board 121 may be configured as a two-layer board, that is, the flexible circuit board 121 includes a base layer 183, a first function layer 184 and a second function layer 185 provided on two opposite sides of the base layer 183. Protection layers 182 are provided both on the side of the first function layer 184 away from the base layer 183 and on the side of the second function layer 185 away from the base layer 183, and shielding layers 181 are provided each on the sides of the protection layers 182 away from the base layer 183. The touch chip 13, the resistor R, the capacitor C, and other components are located at the uppermost layer of the flexible circuit board 121. The touch chip 13 is connected to the first function layer 184 through underfill. The underfill is mainly achieved through non-contact spray dispensing. The resistor R and the capacitor C are connected to the first function layer 184 through UV (UV curable) adhesive. The first function layer 184 is connected to the second function layer 185 through the via hole. The touch signal line 131 is provided on the second function layer 185, and the display signal line 1211 is provided on the first function layer 184.

The thickness of the flexible circuit board 121 is approximately 0.12 mm. Compared with the related art, in which the thickness of a six-layer board is approximately 0.36 mm and the thickness of a four-layer board is approximately 0.24 mm, the thickness is decreased significantly. The height of the touch chip 13 is approximately 0.427 mm to 0.777 mm, and the touch chip 13 is provided in a groove on the flexible circuit board 121, so that the maximum thickness of the entire flexible circuit board 121 does not exceed 0.9 mm.

Figure 11:
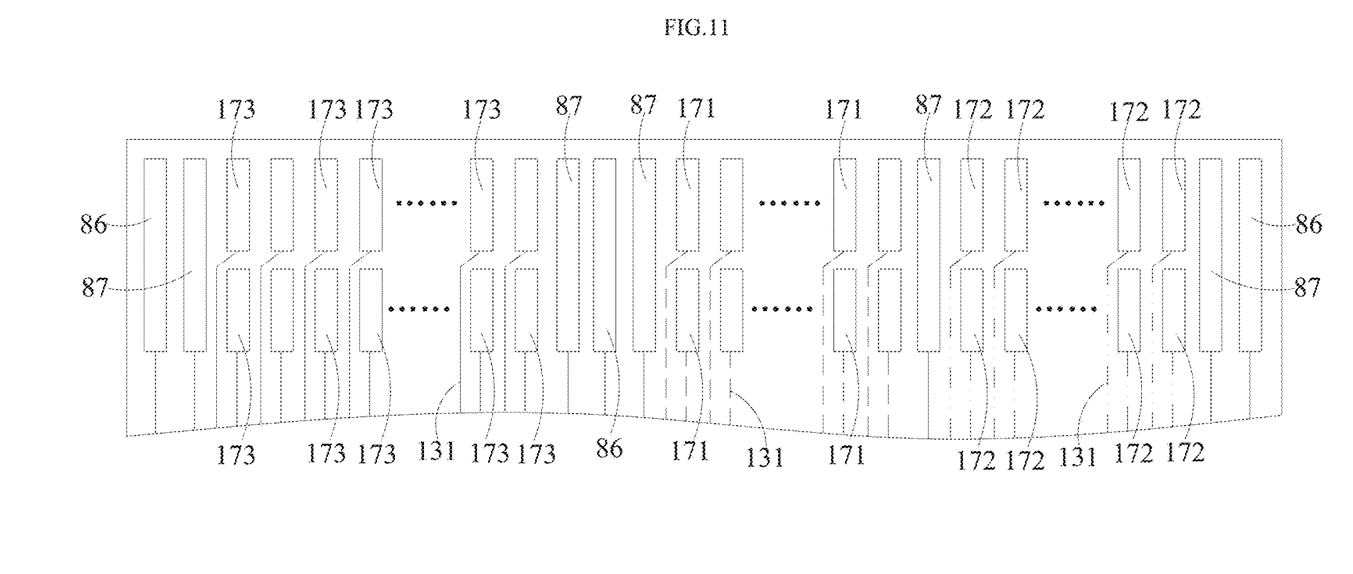
FIG. 11 is a schematic structural diagram of a touch bonding pin on a flexible circuit board in a touch display device according to some embodiments of the present disclosure.

Referring to FIG. 11, the flexible circuit board 121 is provided with second touch sensing bonding pins 173, third touch driving bonding pins 171 and fourth touch driving bonding pins 172. The third touch driving bonding pin 171 is bound correspondingly to the first touch driving bonding pin 814, the fourth touch driving bonding pin 172 is bound correspondingly to the second touch driving bonding pin 815, and the second touch sensing bonding pin 173 is bound correspondingly to the first touch sensing bonding pin 823. The second touch sensing bonding pin 173, the third touch driving bonding pin 171, and the fourth touch driving bonding pin 172 are connected to the touch chip 13 through the touch signal lines 131. The touch chip 13, the touch signal line 131, the second touch sensing bonding pin 173, the third touch driving bonding pin 171 and the fourth touch driving bonding pin 172 are provided on the same side of the display signal line 1211, so that the touch signal line 131 that connects the touch chip 13 to the second touch sensing bounding pin 173, the third touch driving bounding pin 171, and the fourth touch driving bounding pin 172 does not need to be provided intersected with the display signal line 1211. Therefore, there will be no signal interference between the touch signal line 131 and the display signal line 1211, and there is no need to use a multi-layer board to avoid signal interference between the touch signal line 131 and the display signal line 1211.

Figure 10:
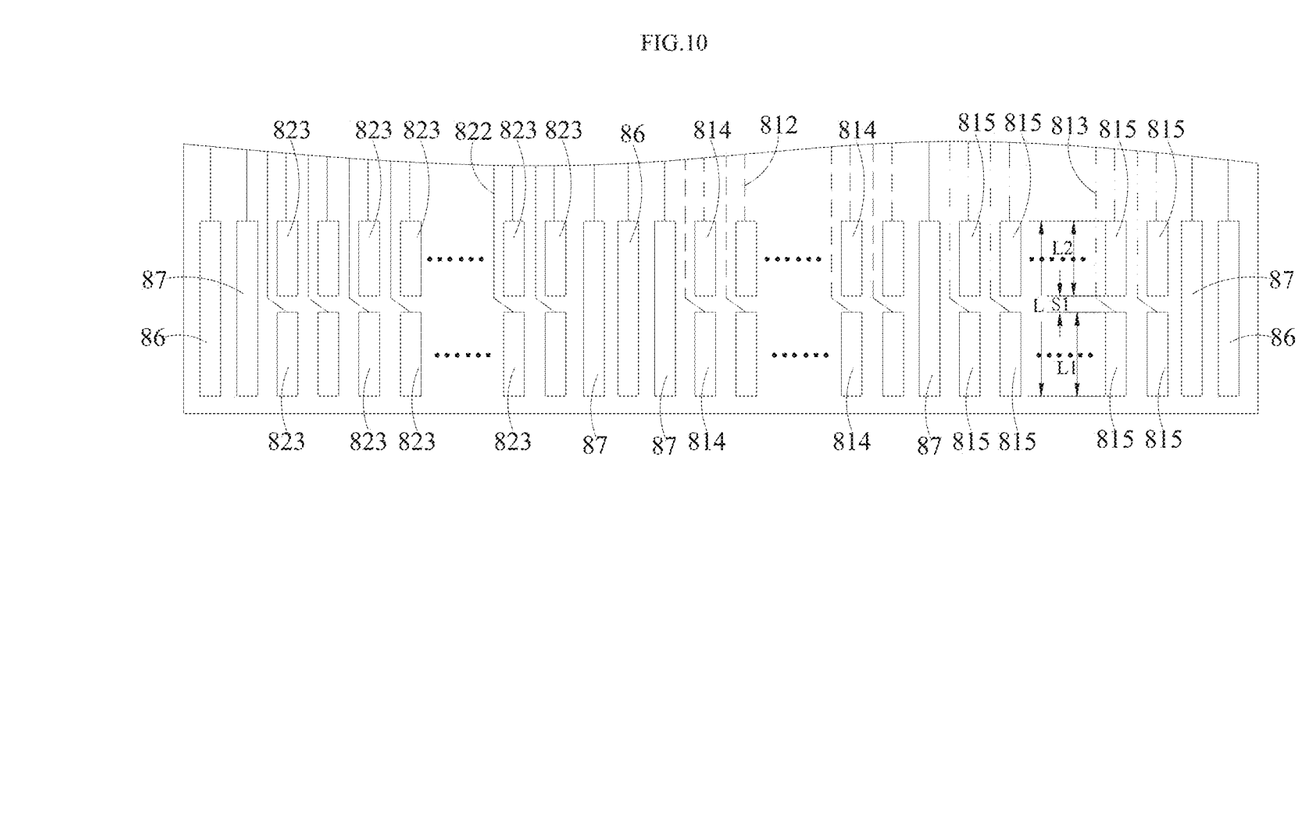
FIG. 10 is a schematic structural diagram of a touch bonding pin on a touch display substrate in a touch display device according to some embodiments of the present disclosure.

Referring to FIG. 10 and FIG. 11, two first touch driving bonding pins 814 are arranged in the second direction Y to form a group, that is, the length of the first touch driving bonding pin 814 is reduced, so that two first touch driving bonding pins 814 can be provided within the area in which one first touch driving bonding pin 814 is provided in the related art. A plurality of groups of first touch driving bonding pins 814 are arranged in the first direction X, and the first direction X intersects with the second direction Y. In some embodiments, the first direction X is perpendicular to the second direction Y. Three or more first touch driving bonding pins 814 may also be arranged in the second direction Y to form a group. Correspondingly, the third touch driving bonding pins 171 provided on the flexible circuit board 121 are also configured as a structure adapted to the first touch driving bonding pins 814, that is, the area of the third touch driving bonding pin 171 is reduced, at least two third touch driving bonding pins 171 are arranged in the second direction Y to form a group, and a plurality of groups of third touch driving bonding pins 171 are arranged in the first direction X.

Two second touch driving bonding pins 815 are arranged in the second direction Y to form a group, that is, the length of the second touch driving bonding pin 815 is reduced, so that two second touch driving bonding pins 815 can be provided within the area in which one second touch driving bonding pin 815 is provided in the related art. A plurality of groups of second touch driving bonding pins 815 are arranged in the first direction X, and the first direction X intersects with the second direction Y. In some embodiments, the first direction X is perpendicular to the second direction Y. Certainly, three or more second touch driving bonding pins 815 may also be arranged to form a group in the second direction Y. Correspondingly, the fourth touch driving bonding pins 172 provided on the flexible circuit board 121 are also configured as a structure adapted to the second touch driving bonding pins 815, that is, the area of the fourth touch driving bonding pin 172 is reduced, at least two fourth touch driving bonding pins 172 are arranged in the second direction Y to form a group, and a plurality of groups of fourth touch driving bonding pins 172 are arranged in the first direction X.

Two first touch sensing bonding pins 823 are arranged in the second direction Y to form a group, that is, the pin length of the first touch sensing bonding pins 823 is reduced, so that two first touch sensing bonding pins 823 can be provided within the area in which one first touch sensing bonding pin 823 is provided in the related art. A plurality of groups of first touch sensing bonding pins 823 are arranged in the first direction X, and the first direction X intersects with the second direction Y. In some embodiments, the first direction X is perpendicular to the second direction Y. Certainly, three or more first touch sensing bonding pins 823 may also be arranged to form a group in the second direction Y. Correspondingly, the second touch sensing bonding pins 173 provided on the flexible circuit board 121 are also configured as a structure adapted to the first touch sensing bonding pins 823, that is, the area of the second touch sensing bonding pins 173 is reduced, at least two second touch sensing bonding pins 173 are arranged in the second direction Y to form a group, and a plurality of groups of second touch sensing bonding pins 173 are arranged in the first direction X.

In the example embodiment, the ground bonding pin and the protection bonding pin may be configured as a longer structure. The first touch driving bonding pin 814, the second touch driving bonding pin 815, and the first touch sensing bonding pin 823 may be configured as a shorter structure. The group length of the group formed by at least two touch bonding pins arranged in the second direction Y is less than or equal to the length of the ground bonding pin 86 or the protection bonding pin 87 in the second direction Y.

It should be noted that the group length L refers to the sum of the sum (L1+L2) of the lengths of two touch bonding pins in the second direction Y and the distance (S1) between the two adjacent touch bonding pins, that is, L=L1+L2+S1. In the case that three touch bounding pins are arranged in the second direction Y to form a group, there are two distances between the three touch bounding pins. Therefore, the group length refers to the sum of the sum of the lengths of the three touch bonding pins in the second direction Y and the sum of two distances between two adjacent touch bonding pins. For the case that more touch bounding pins are arranged in the second direction to form a group, it can be inferred and will not be repeated here.

In the example embodiment, referring to FIG. 10, a ground bonding pin 86 is provided on the outer side of the plurality of first touch sensing bonding pins 823, and a ground bonding pin 86 is also provided on the outer side of the plurality of first touch driving bonding pins 814 and the plurality of second touch driving bonding pins 815. A protection bonding pin 87 is provided between the ground bonding pin 86 and the first touch sensing bonding pin 823. The ground bonding pin 86 can be isolated from the first touch sensing bonding pin 823 by the protection bonding pin 87, thereby avoiding interference to the grounding signal. A protection bonding pin 87 is also provided between the ground bonding pin 86 and the first touch driving bonding pin 814, and between the ground bonding pin 86 and the second touch driving bonding pin 815. The ground bonding pin 86 can be isolated from the first touch driving bonding pin 814 and the second touch driving bonding pin 815 by the protection bonding pin 87, thereby avoiding interference to the grounding signal. A protection bounding pin 87 is also provided between adjacent pins of the first touch driving bonding pin 814 and the second touch driving bonding pin 815. It should be noted that the ground bonding pin 86 is connected to a ground bonding lead, and the protection bonding pin 87 is connected with a protection bonding lead; and the leads on the two sides of the ground bonding lead and the protection bonding lead are correspondingly consistent with the pins on the two sides of the ground bonding pin 86 and the protection bonding pin 87.

Figure 12:
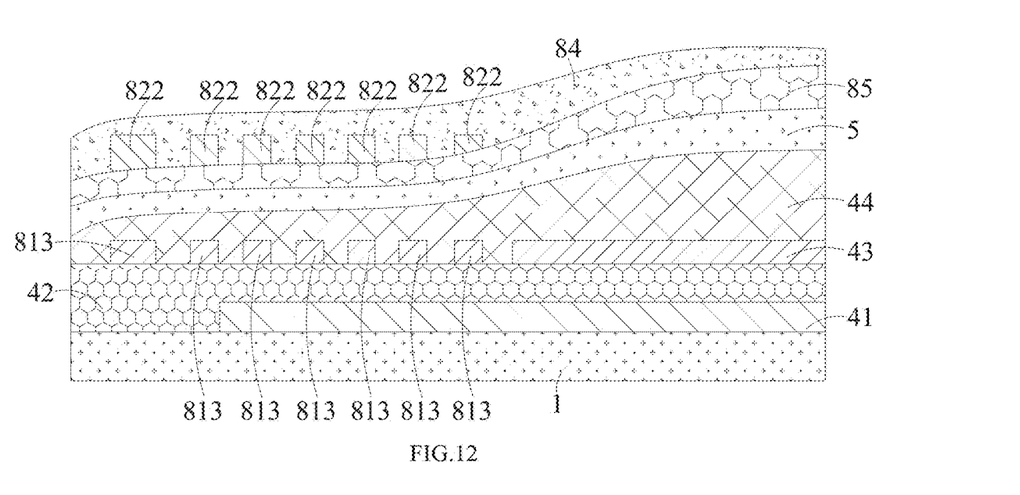
FIG. 12 is a cross-sectional view in accordance with A-A section in FIG. 5.
Figure 13:
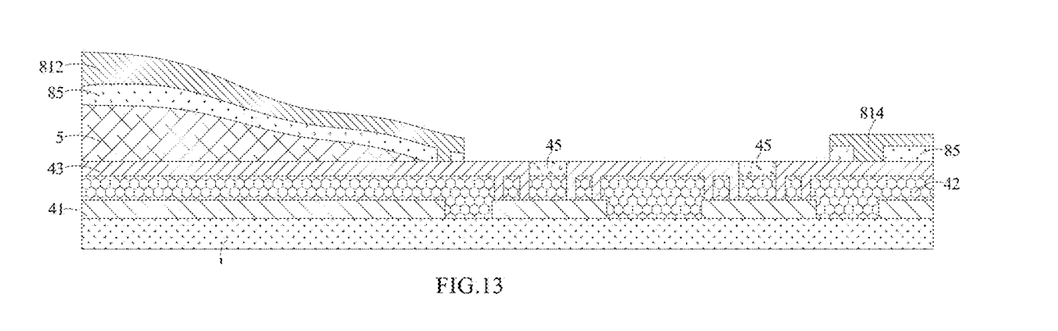
FIG. 13 is a cross-sectional view in accordance with B-B section in FIG. 5.

In the example embodiment, referring to FIG. 12, in the lead region, the touch sensing lead 822 is provided on the same layer and with the same material as the first touch metal layer 8a, and the second touch driving lead 813 is provided on the same layer and with the same material as the source and the drain (the data line 43). A first planarization layer 44 is provided on the side of the second touch driving lead 813 away from the base substrate 1. With reference to FIG. 13, in the lead region, the first touch driving lead 812 is provided on the same layer and with the same material as the second touch metal layer 8b. The bending region is not provided with a first touch metal layer 8a and a second touch metal layer 8b. The first touch metal layer 8a and the second touch metal layer 8b are connected to the data lines 43 through via holes, and are connected to the bonding pins through the data lines 43, thereby reducing the thickness of the bending region and facilitating bending. In the bending region, the touch sensing lead may also adopt a structure similar to that of the first touch driving lead, that is, the touch sensing lead and the first touch driving lead are provided on the same layer and with the same material as the source and the drain. A second planarization layer 45 is provided on a side of the gate insulation layer 42 away from the base substrate 1.

The so-called being provided on a same layer and with a same material is formed by a same patterning process. Since the first touch driving lead 812 needs to be connected to the first touch unit 81, the second touch metal layer 8b may include a first connection portion 88. Therefore, when formed, a structure that the first connection portion 88 is connected to the first touch driving lead 812 is directly formed, and the first touch driving lead 812 is connected to the first touch unit 81. Similarly, the touch sensing lead 822 needs to be connected to the second touch unit 82. Therefore, when formed, a structure that the touch sensing lead 822 is connected to the second touch unit 82 is directly formed. The first touch metal layer 8a may include a second touch unit 82 and a first touch electrode 811 provided at intervals. The second touch driving lead 813 also needs to be connected to the first touch unit 81, but is not formed with the first touch unit 81 through the same patterning process, and can be connected through a bridging structure. In this way, the second touch driving lead 813 and the touch sensing lead 822 may be provided on different layers on the same side, and signal interference is avoided. Furthermore, the second side region C2 may be made narrower, and the requirement of a narrow frame is satisfied.

Certainly, according to different configurations of the first touch unit 81 and the second touch unit 82, that is, in the condition that the first touch unit 81 is entirely provided on the first touch metal layer 8a, and the second touch unit 82 is connected through the bridging structure provided on the second touch metal layer 8b, the first touch driving lead 812 may be provided on the same layer and with the same material as the first touch metal layer 8a of the touch structure, and the touch sensing lead 822 may be provided on the same layer and with the same material as the second touch metal layer 8b of the touch structure.

Of course, in some other example embodiments of the present disclosure, the second touch driving lead 813 may also be provided on the same layer and with the same material as the first touch unit 81. The second touch driving lead 813 and the touch sensing lead 822 are provided on two opposite sides of the display region AA, that is, the second touch driving lead 813 passes through the second side region C2, and the touch sensing lead 822 passes through the fourth side region C4.

In addition, it should be noted that virtual bonding pins or other functional test pins may be provided on the other side of the display driving chip 14 where there is not provided with the touch bonding region BOD2.

Furthermore, the embodiments of the present disclosure provide a display system. The display system may include any one of the touch display devices described above. The specific structure of the touch display device has been described in detail, and therefore, details are not described here again.

However, the specific type of the display system is not particularly limited. Commonly used display system types in the art can be used, for example, mobile. Those skilled in the art may correspondingly select according to the specific use of the display device, which will not be repeated here.

It should be noted that, in addition to the touch display device, the display system further includes other necessary components and composition, taking the display as an example, such as a housing, a circuit board, a power line, and the like. Those skilled in the art may make corresponding supplement according to the specific use requirements of the display system, which will not be described here again.

Compared with the related art, the beneficial effects of the display system provided by the embodiments of the present disclosure are the same as the beneficial effects of the touch display device provided in the above example embodiments, which will not be described here again.

Other embodiments of the present disclosure will be apparent to those skilled in the art from consideration of the specification and practice of the present disclosure here. The present disclosure is intended to cover any variations, uses, or adaptations of the present disclosure following the general principles of the present disclosure and including common general knowledge or conventional technical means in the art not disclosed in the present disclosure. The specification and embodiments are considered as examples only, and the true scope and spirit of the present disclosure are indicated by the appended claims.

What is claimed is:

1. A touch display device, comprising:
    a touch display substrate, provided with a display region and a non-display region provided adjacent to the display region, wherein the non-display region is provided with a display bonding region and a touch bonding region; and
    a flexible circuit board, provided with a touch signal line, a touch chip and a display signal line, wherein the touch signal line is connected with the touch chip, the flexible circuit board is bound with the touch display substrate in the display bonding region and the touch bonding region, the touch chip is connected to the touch bonding region through the touch signal line, and the display signal line is connected to the display bonding region;
    wherein the touch chip, the touch signal line and the touch bonding region are provided on a same side of the display signal line;
    wherein the flexible circuit board is configured as a two-layer board, the two-layer board at least comprises a first function layer, a second function layer, and a substrate layer provided between the first function layer and the second function layer, the display signal line is provided on the first function layer, and the touch signal line is provided on the second function layer.

2. The touch display device according to claim 1, wherein in the touch bonding region, the touch display substrate comprises a plurality of touch bonding pins, at least two touch bonding pins are arranged in a second direction to form a group, a plurality of groups of the touch bonding pins are arranged in a first direction, and the first direction intersects with the second direction.

3. The touch display device according to claim 2, wherein the touch bonding pins comprise a first touch driving bonding pin, a second touch driving bonding pin and a first touch sensing bonding pin; the first touch driving bonding pin, the second touch driving bonding pin and the first touch sensing bonding pin are all provided at intervals, and the first touch driving bonding pin is located between the second touch driving bonding pin and the first touch sensing bonding pin.

4. The touch display device according to claim 2, wherein in the touch bonding region, the touch display substrate further comprises a plurality of ground bonding pins and a plurality of protection bonding pins, and a group length of the group formed by the at least two touch bonding pins arranged in the second direction is less than or equal to a length of the ground bonding pins or the protection bonding pins in the second direction.

5. The touch display device according to claim 3, wherein in the display region, the touch display substrate comprises:
    a plurality of pixel units arranged in an array, wherein a pixel unit comprises at least three sub-pixels, a sub-pixel comprises a thin film transistor, and the thin film transistor comprises a gate, a gate insulation layer, an active layer, a source and a drain; and
    a touch structure, provided on a side of the pixel unit, wherein the touch structure comprising a plurality of first touch units and a plurality of second touch units.

6. The touch display device according to claim 5, wherein one of the plurality of first touch units is a touch driving unit, one of the plurality of second touch units is a touch sensing unit, an end of the one of the plurality of first touch units is connected to the first touch driving bonding pin through a first touch driving lead, and the one of the plurality of second touch units is connected to the first touch sensing bonding pin through a touch sensing lead.

7. The touch display device according to claim 6, wherein another opposite end of the one of the plurality of first touch units is connected to the second touch driving bonding pin through a second touch driving lead.

8. The touch display device according to claim 7, wherein the second touch driving lead is provided on a same layer and with a same material as the source and the drain.

9. The touch display device according to claim 6, wherein the non-display region is further provided with a bending region and a lead region; the bending region is located between the display bonding region and the touch bonding region and the lead region; and in the lead region, the first touch driving lead is provided on a same layer and with a same material as a second touch metal layer of the touch structure.

10. The touch display device according to claim 9, wherein in the lead region, the touch sensing lead is provided on a same layer and with a same material as a first touch metal layer of the touch structure.

11. The touch display device according to claim 9, wherein in the bending region, the touch sensing lead and the first touch driving lead are provided on a same layer and with a same material as the source and the drain.

12. The touch display device according to claim 3, wherein the flexible circuit board is provided with a third touch driving bonding pin, a fourth touch driving bonding pin and a second touch sensing bonding pin; the third touch driving bonding pin is bound to or orthographic projection overlapped with the first touch driving bonding pin, the fourth touch driving bonding pin is bound to or orthographic projection overlapped with the second touch driving bonding pin, and the second touch sensing bonding pin is bound to or orthographic projection overlapped with the first touch sensing bonding pin.

13. A display system, comprising a touch display device, wherein the touch display device comprises:
    a touch display substrate, provided with a display region and a non-display region provided adjacent to the display region, wherein the non-display region is provided with a display bonding region and a touch bonding region; and
    a flexible circuit board, provided with a touch signal line, a touch chip and a display signal line, wherein the touch signal line is connected with the touch chip, the flexible circuit board is bound with the touch display substrate in the display bonding region and the touch bonding region, the touch chip is connected to the touch bonding region through the touch signal line, and the display signal line is connected to the display bonding region;
    wherein the touch chip, the touch signal line and the touch bonding region are provided on a same side of the display signal line;
    wherein the flexible circuit board is configured as a two-layer board, the two-layer board at least comprises a first function layer, a second function layer, and a substrate layer provided between the first function layer and the second function layer, the display signal line is provided on the first function layer, and the touch signal line is provided on the second function layer.

14. The touch display device according to claim 2, wherein the touch bonding pins comprise a first touch driving bonding pin and a first touch sensing bonding pin, and the first touch driving bonding pin and the first touch sensing bonding pin are provided at intervals.

15. The touch display device according to claim 6, wherein the one of the plurality of first touch units comprises a plurality of first touch electrodes and first connection portions sequentially arranged in the second direction, the plurality of first touch electrodes are provided at intervals, and adjacent first touch electrodes are connected to each other through a first connection portion.

16. The touch display device according to claim 15, wherein the one of the plurality of second touch units comprises a plurality of second touch electrodes and second connection portions sequentially arranged in the first direction, the plurality of second touch electrodes are provided at intervals, and adjacent second touch electrodes are connected to each other through a second connection portion.

17. The touch display device according to claim 16, wherein a first touch electrode and a second touch electrode are alternately arranged in a third direction to form a capacitor.

18. The touch display device according to claim 17, wherein the third direction is perpendicular to a plane formed by the first direction and the second direction.

19. The touch display device according to claim 17, wherein the first touch electrode or the second touch electrode is in a form of a metal grid.

\* \* \* \* \*